(12) United States Patent
Karpovych et al.

(10) Patent No.: US 9,480,172 B2
(45) Date of Patent: Oct. 25, 2016

(54) METHOD FOR PRODUCING A PRINTED CIRCUIT BOARD CONSISTING OF AT LEAST TWO PRINTED CIRCUIT BOARD REGIONS, AND PRINTED CIRCUIT BOARD

(71) Applicant: AT & S Austria Technologie & Systemtechnik Aktiengesellschaft, Leoben-Hinterberg (AT)

(72) Inventors: Volodymyr Karpovych, Graz (AT); Johannes Stahr, St. Lorenzen (AT)

(73) Assignee: AT & S AUSTRIA TECHNOLOGIE & SYSTEMTECHNIK AKTIENGESELLSCHAFT, Hinterberg (AT)

( * ) Notice: Subject to any disclaimer, the term of this patent is extended or adjusted under 35 U.S.C. 154(b) by 226 days.

(21) Appl. No.: 14/368,623

(22) PCT Filed: Dec. 28, 2012

(86) PCT No.: PCT/AT2012/000325
§ 371 (c)(1),
(2) Date: Jun. 25, 2014

(87) PCT Pub. No.: WO2013/096983
PCT Pub. Date: Jul. 4, 2013

(65) Prior Publication Data
US 2014/0376196 A1 Dec. 25, 2014

(30) Foreign Application Priority Data
Dec. 28, 2011 (AT) .................................. GM684/2011

(51) Int. Cl.
*H05K 1/18* (2006.01)
*H05K 3/36* (2006.01)
(Continued)

(52) U.S. Cl.
CPC ............... *H05K 3/4611* (2013.01); *H05K 1/11* (2013.01); *H05K 1/142* (2013.01); *H05K 1/18* (2013.01);
(Continued)

(58) Field of Classification Search
CPC .......... H05K 1/11; H05K 1/142; H05K 1/18; H05K 2201/09045; H05K 2201/0919; H05K 2201/09572; H05K 2201/1059; H05K 3/368; H05K 3/403; H05K 3/4611; H05K 3/4694; H05K 2201/209
USPC ............................................. 361/748; 29/830
See application file for complete search history.

(56) References Cited

U.S. PATENT DOCUMENTS 3,365,620 A * 1/1968 Im .......................... H01L 23/473
257/697
4,931,021 A * 6/1990 Mohan ................. G02B 6/3833
439/284

(Continued)

FOREIGN PATENT DOCUMENTS

JP H10-290054 10/1998
JP 2001-237551 A 8/2001
(Continued)

*Primary Examiner* — Timothy Thompson
*Assistant Examiner* — Rhadames J Alonzo Miller
(74) *Attorney, Agent, or Firm* — Jacobson Holman, PLLC.

(57) ABSTRACT

A printed circuit board and a method for producing a printed circuit board consisting of at least two printed circuit board regions, wherein the printed circuit board regions each comprise at least one conductive layer and/or at least one conductive component, wherein printed circuit board regions to be connected to one another, in the region of in each case at least one lateral surface directly adjoining one another, are connected to one another by a mechanical coupling. At least one sub-region or connection port of the conductive layer, and/or a conductive element of the component are electrically conductively coupled to each other at the lateral surface.

36 Claims, 7 Drawing Sheets

(51) Int. Cl.
  *H05K 3/46* (2006.01)
  *H05K 3/40* (2006.01)
  *H05K 1/14* (2006.01)
  *H05K 1/11* (2006.01)

(52) U.S. Cl.
  CPC ............ *H05K 3/403* (2013.01); *H05K 3/4694* (2013.01); *H05K 3/368* (2013.01); *H05K 2201/0919* (2013.01); *H05K 2201/09045* (2013.01); *H05K 2201/09572* (2013.01); *H05K 2201/1059* (2013.01); *H05K 2201/209* (2013.01); *Y10T 29/49126* (2015.01)

(56) References Cited

U.S. PATENT DOCUMENTS

| | | | | |
|---|---|---|---|---|
| 4,938,701 A * | 7/1990 | Heberling | ............ | H01R 12/732 439/327 |
| 4,981,336 A * | 1/1991 | Mohan | ................ | G02B 6/3833 385/56 |
| 5,041,015 A * | 8/1991 | Travis | .................. | H01R 43/205 439/492 |
| 5,938,455 A * | 8/1999 | Glovatsky | .............. | H01R 12/58 439/290 |
| 5,996,222 A * | 12/1999 | Shangguan | .......... | H05K 1/0284 29/840 |
| 6,229,942 B1 * | 5/2001 | Engberg | ............... | G02B 6/3608 385/14 |
| 6,534,726 B1 * | 3/2003 | Okada | ............... | H01L 23/49805 174/260 |
| 7,413,481 B2 * | 8/2008 | Redmond, III | ...... | H01R 13/514 439/49 |
| 2002/0080590 A1 * | 6/2002 | Bauermeister | ......... | H05K 1/142 361/803 |
| 2002/0117753 A1 | 8/2002 | Lee et al. | | |
| 2005/0016897 A1 * | 1/2005 | Cho | ........................ | H01L 23/13 206/713 |
| 2007/0155194 A1 * | 7/2007 | Vega Martinez | ...... | H05K 1/142 439/62 |
| 2007/0159204 A1 * | 7/2007 | Hara | ....................... | H01L 23/32 257/773 |
| 2007/0281505 A1 * | 12/2007 | Kobayashi | ........... | H05K 3/4691 439/69 |
| 2008/0099230 A1 * | 5/2008 | Takahashi | ............ | H05K 3/4691 174/250 |
| 2008/0144299 A1 * | 6/2008 | Redmond | ............ | H05K 1/0286 361/764 |
| 2010/0115766 A1 * | 5/2010 | Hasegawa | ............ | H05K 3/0097 29/830 |
| 2012/0108082 A1 * | 5/2012 | Werner | ................ | H01R 12/732 439/78 |
| 2012/0275124 A1 * | 11/2012 | Pludra | .................... | H05K 1/142 361/749 |

FOREIGN PATENT DOCUMENTS

| | | |
|---|---|---|
| WO | 2008/134809 A1 | 11/2008 |
| WO | 2011/003123 A1 | 1/2011 |

* cited by examiner

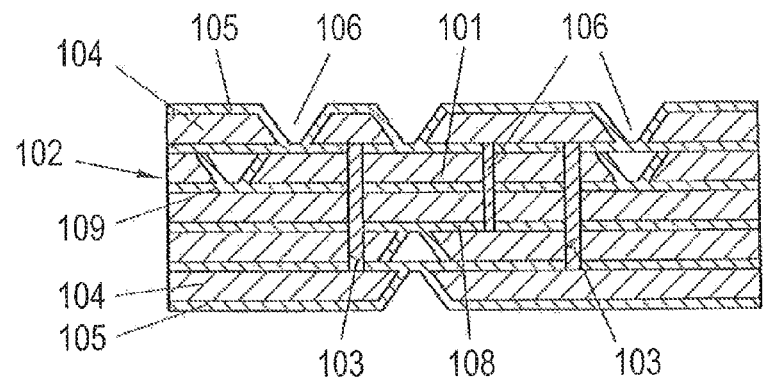
Fig. 1a
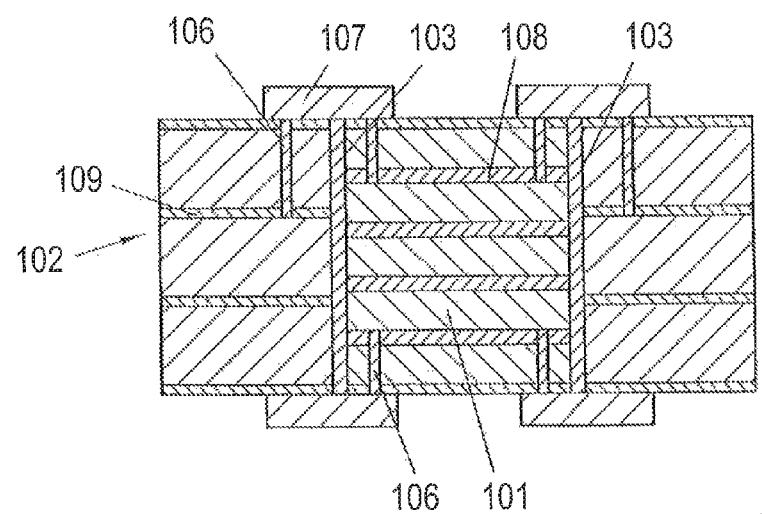
Fig. 1b
Fig. 1
(Prior Art)
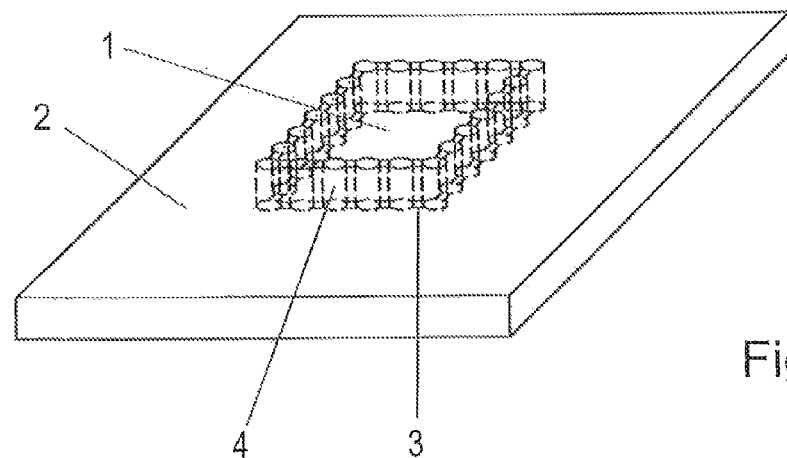
Fig. 2

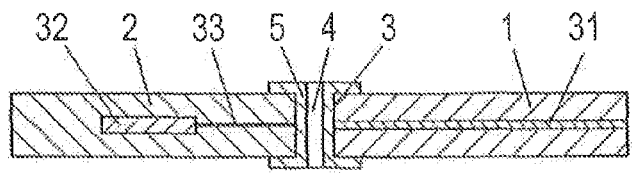
Fig. 3a
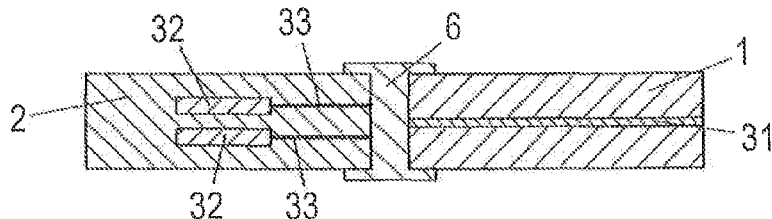
Fig. 3b
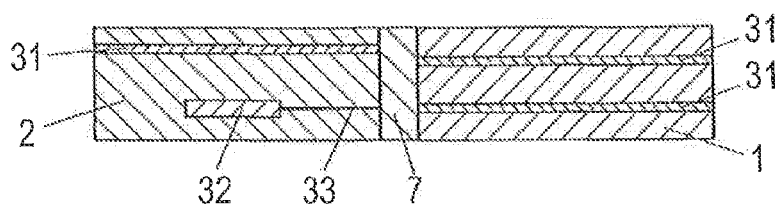
Fig. 3c
Fig. 3
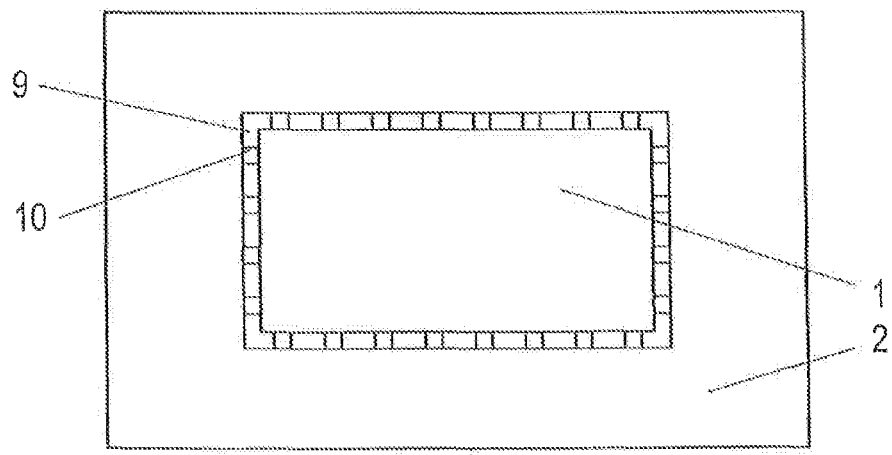
Fig. 4a
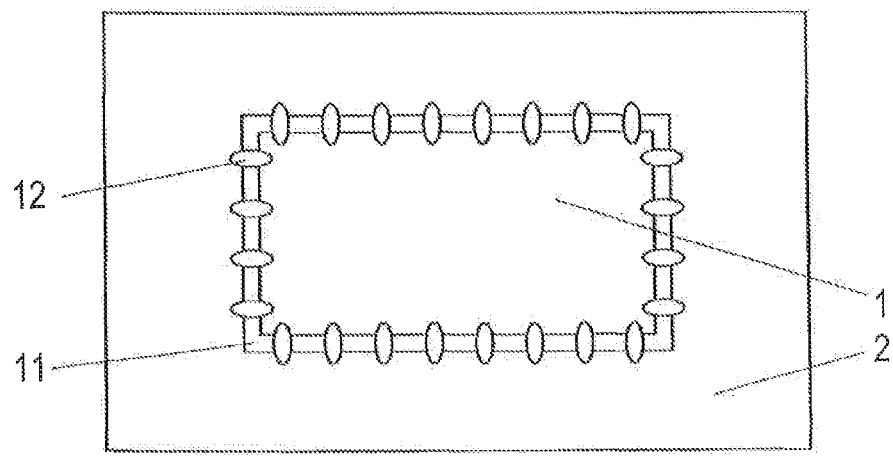
Fig. 4b
Fig. 4

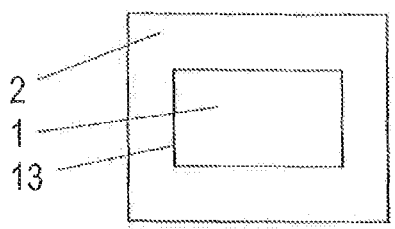
Fig. 5a
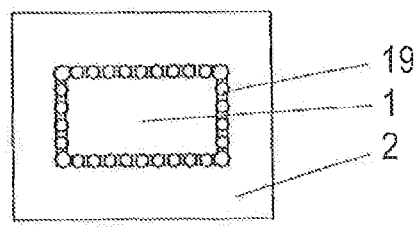
Fig. 6a
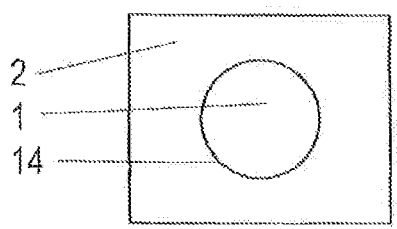
Fig. 5b
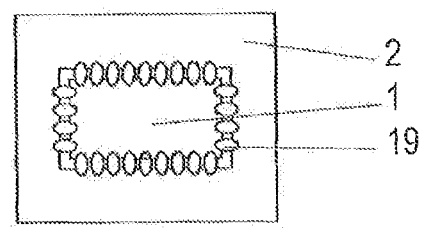
Fig. 6b
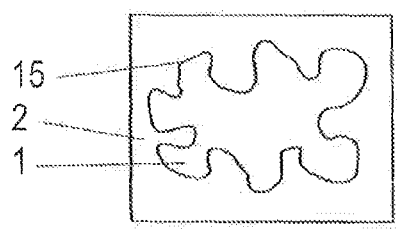
Fig. 5c
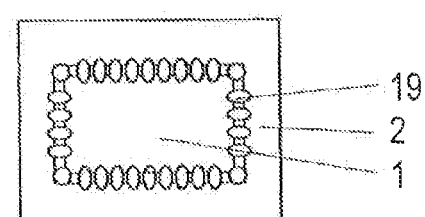
Fig. 6c
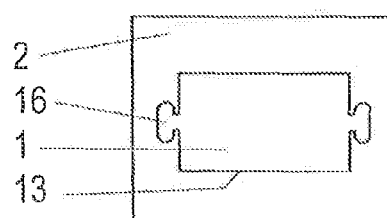
Fig. 5d
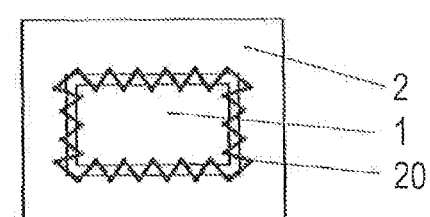
Fig. 6d
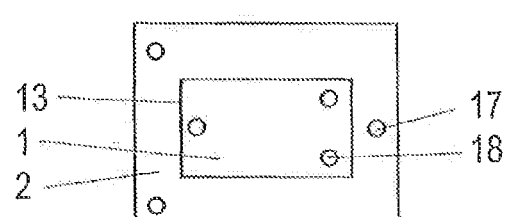
Fig. 5e
Fig. 6

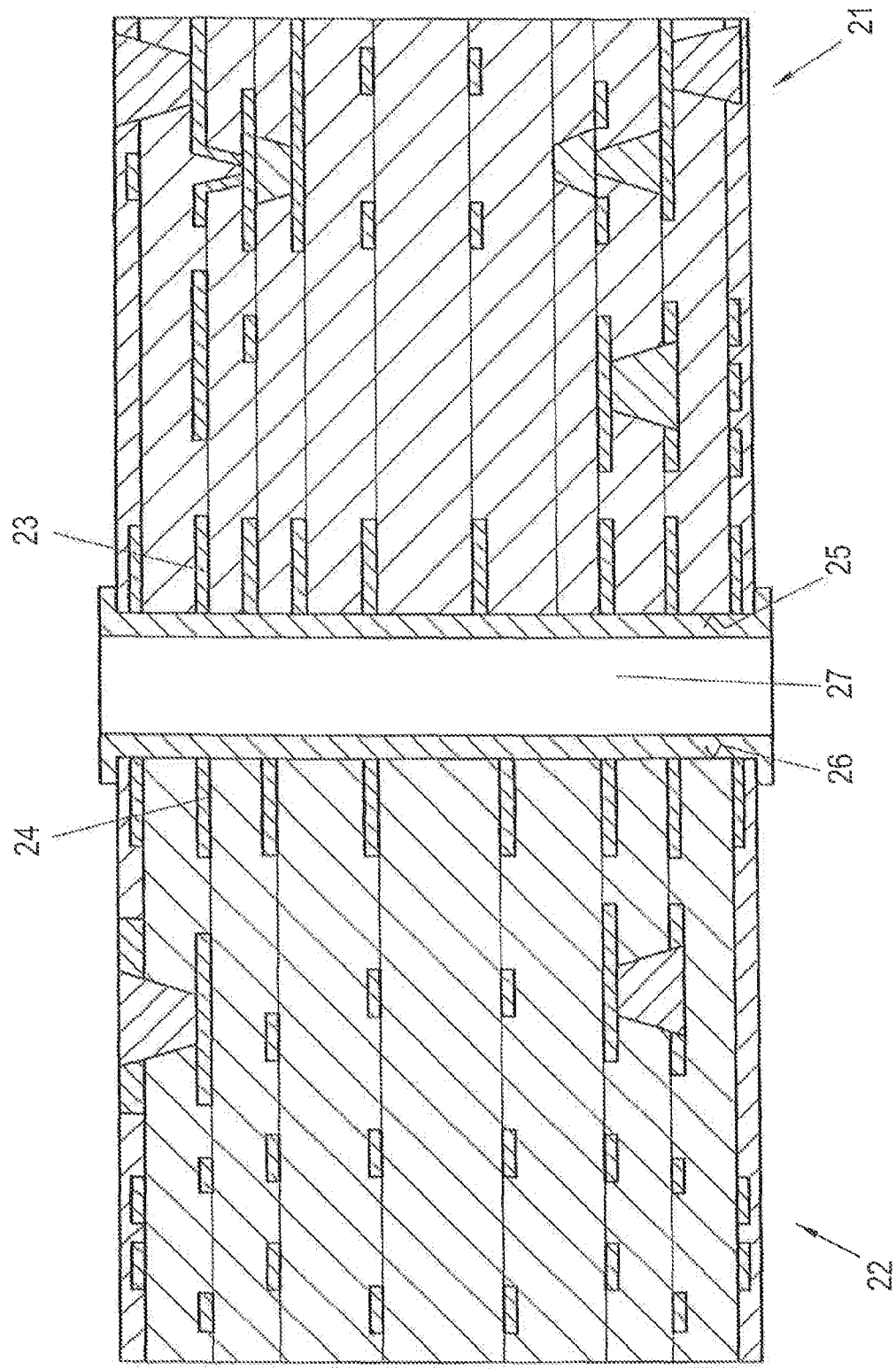

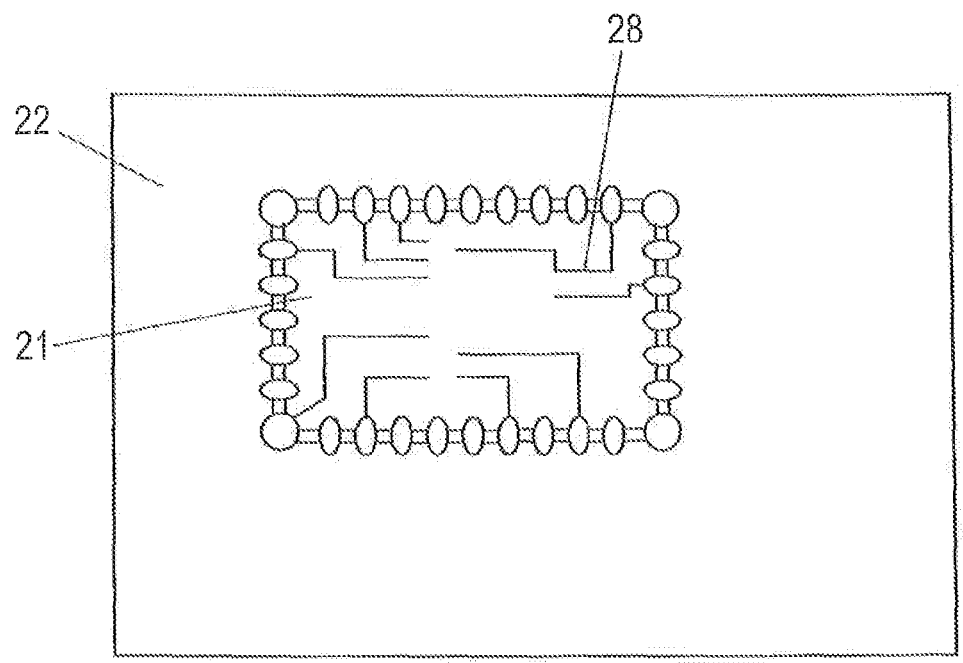
Fig. 8b
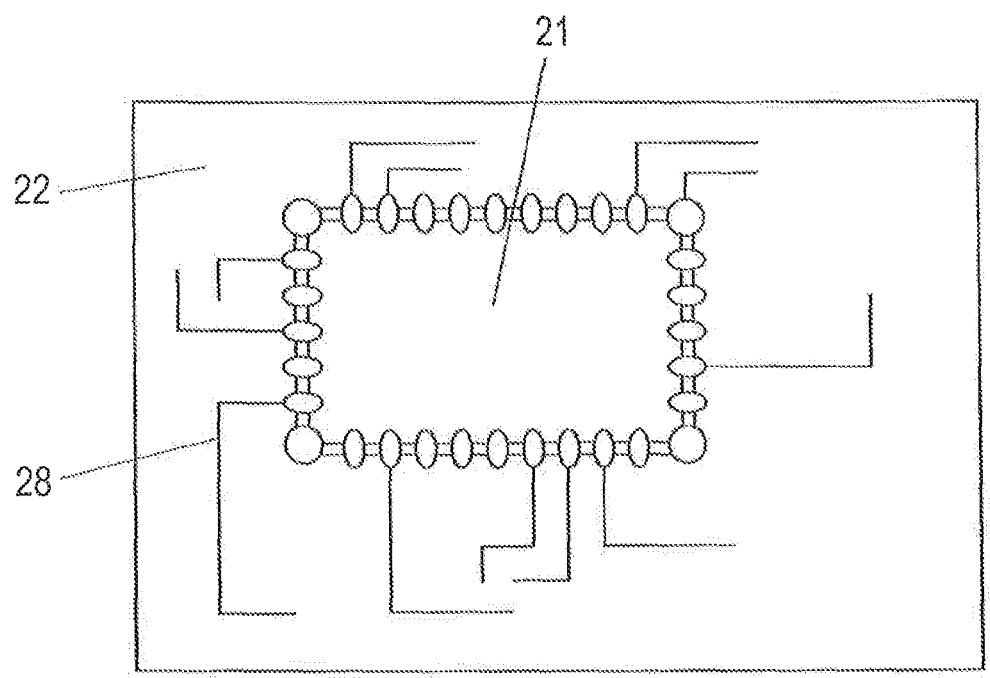
Fig. 8c
Fig. 8

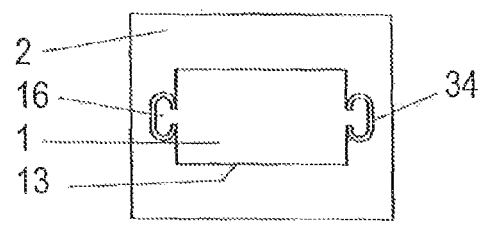
Fig. 9
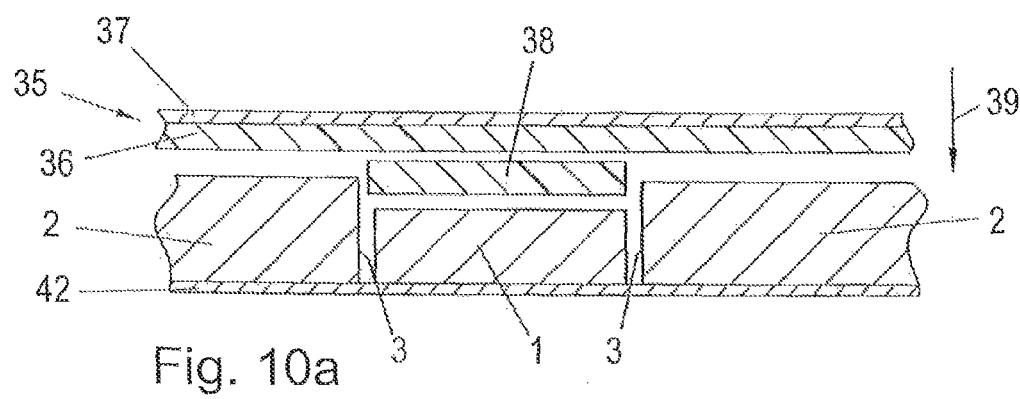
Fig. 10a
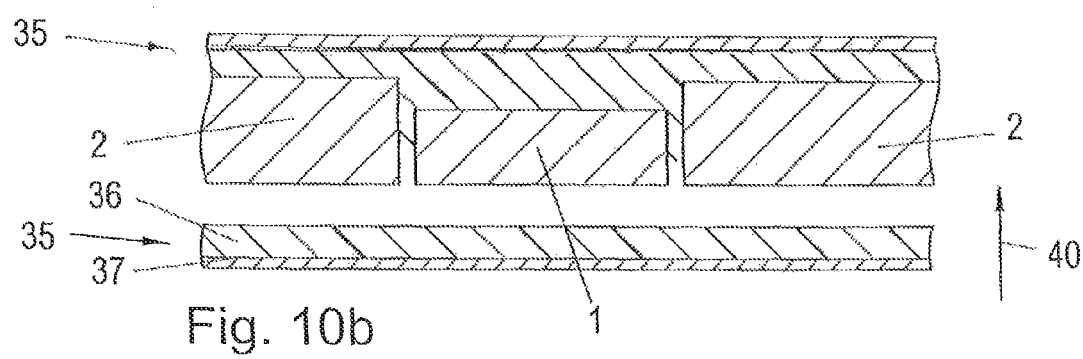
Fig. 10b
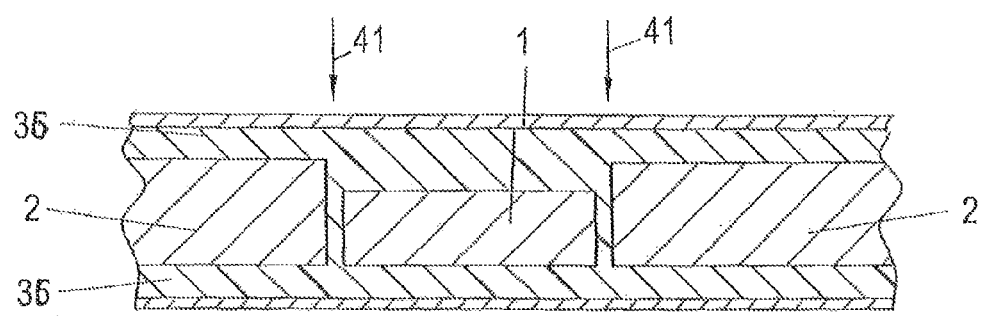
Fig. 10c
Fig. 10

METHOD FOR PRODUCING A PRINTED CIRCUIT BOARD CONSISTING OF AT LEAST TWO PRINTED CIRCUIT BOARD REGIONS, AND PRINTED CIRCUIT BOARD

This is a national stage of PCT/AT2012/000325 filed Dec. 28, 2012 and published in German, which has a priority of Austria no. GM 684/2011 filed Dec. 28, 2011, hereby incorporated by reference.

FIELD OF THE INVENTION

The present invention relates to a method for producing a printed circuit board consisting of at least two printed circuit board regions, wherein the printed circuit board regions each comprise at least one conductive layer, in particular a structured conductive layer, and/or at least one device or conductive component, wherein printed circuit board regions to be connected to one another, in the region of in each case at least one lateral surface directly adjoining one another, are connected to one another by a mechanical coupling or connection, wherein at least one subregion or connection port of the at least one conductive layer and/or a conductive element of the device or component of the printed circuit board regions mechanically connected or to be mechanically connected to one another are electrically conductively connected or coupled to each other on the at least one lateral surface adjoining one another. The present invention, moreover, relates to a printed circuit board consisting of at least two printed circuit board regions, wherein the printed circuit board regions each comprise at least one conductive layer, in particular a structured conductive layer, and/or at least one device or conductive component, wherein printed circuit board regions to be connected to one another, in the region of in each case at least one lateral surface directly adjoining one another, are connected to one another by a mechanical coupling or connection, wherein an electrically conductive coupling or connection is provided or formed between at least one subregion or connection port of the at least one conductive layer and/or a conductive element of the device or component of the printed circuit board regions mechanically connected or to be mechanically connected to one another, on the at least one lateral surface adjoining one another.

PRIOR ART in the context of the production of printed circuit boards, it has become increasingly common to produce or assemble a printed circuit board of at least two printed circuit board regions that are, in particular, separately produced and consist of horizontally connected regions frequently made of different materials, by applying, for instance, a mode of procedure known, for instance, as modularization, since individual subregions of a printed circuit board have to meet different demands. Thus, it is, for instance, known that power electronics is integrated or received in subregions of a printed circuit board, while, in particular, digital technology is implemented in other regions of a printed circuit board. The production of a printed circuit board comprising, for instance, both power electronics and digital technology does not make sense in terms of both production expenditures and the implementation of electrical and mechanical couplings, and will usually result in elevated costs. Moreover, different production techniques or methods have increasingly been employed bearing in mind an increasingly desired miniaturization of such printed circuit boards, which cannot be readily combined either.

Such a printed circuit board, which is constructed by coupling superimposed layers of different materials, i.e. comprises what is called a hybrid structure, or comprises subregions in which high-frequency or power electronics is integrated, finally includes regions of different heating or different expansion coefficients such that a printed circuit board of this type will frequently warp or distort in practical use, whereby its service life and reliability will be significantly reduced.

In order to overcome the above drawbacks, a method and device of the initially defined kind have already been proposed, as can, for instance, be taken from WO 2011/003123 A1. Therein, printed circuit board regions to be arranged one beside the other and connected to one another each comprise a conducting layer and/or at least an element or conductive component, wherein a mechanical connection or coupling of such printed circuit board regions to be connected to one another is to be provided on at least one mutually adjoining side face. While an at least partial mechanical coupling or connection of such printed circuit board regions adjoiningly arranged and to be connected to each other is realized on the side face, the electric coupling or connection of the printed circuit board regions to be connected to one another requires at least one layer or ply that covers the interface between the two printed circuit board regions to be connected to each other and via which a conductive connection is established between conducting subregions or structures and/or devices or components of the printed circuit board regions to be connected to one another. To this end, not only such an additional layer is required, which causes an increase in the thickness of the printed circuit board to be produced, but also an electrical connection has to be made via elaborate passages or vias. The formation and/or arrangement of the latter not only has to be effected in an extremely precise manner by applying sophisticated method steps, in particular in view of the increasing miniaturization, but their arrangement also has to be taken into account when forming the individual printed circuit board regions in order to provide appropriate regions for electrical contacts or connections. Such a configuration thus involves elevated machining and construction expenditures and results in an enlargement of the printed circuit board to be produced of the printed circuit board regions to be connected to one another.

Similarly, WO 2008/134809 A1 proposed a mechanical coupling or connection of printed circuit boards or printed circuit board regions to be connected to one another, via form-fitting, complementary profilings on the contiguous side faces. In that known embodiment, in which the individual printed circuit board regions each form strip-like LED elements, an electrical connection or coupling is, moreover, each provided on the upper side of the printed circuit board regions to be connected, i.e. in corner regions of the contiguous side faces.

A method as well as a printed circuit board of the kind mentioned initially may be taken from JP 2001 237551 A1, for example, aiming at a fixation structure for a multilayer printed circuit board.

Furthermore, similar embodiments may be taken from WO 2008/134809 A1, JP H10 290054 A or US 2002/117753 A1.

SUMMARY OF THE INVENTION

The present invention aims to further develop a method and a printed circuit board of the initially defined kind to the effect that the above-mentioned drawbacks will be avoided when using and assembling different printed circuit board regions to be connected to one another, wherein it is, in particular, aimed at a reliable electrical connection or contacting of the printed circuit board regions to be connected or coupled to one another, which comprise different thicknesses, for example.

To solve these objects, a method of the initially defined kind is essentially characterized in that the printed circuit board regions having different heights or thicknesses are laminated, at least on the surfaces having differently high regions, with a laminate comprising at least one insulating layer facing the printed circuit board regions and a conducting layer, while at least partially filling the gap on the mutually adjoining side faces, and after this the electrically conducting connection of electrically conductive subregions or connection ports is formed on the mutually adjoining side faces. In that an electrically conductive connection or coupling of at least one subregion or connection port of the at least one conductive layer, in particular structured conducting layer or a conductive element of a device or component integrated in a printed circuit board region, on the at least one lateral surface or side face adjoining one another is each provided, an immediate, substantially lateral electrical coupling or connection can thus be provided in addition to the already provided mechanical connection in the region of the respectively mutually adjoining side faces of the printed circuit board regions to be connected to one another. Unlike in the known prior art mentioned above, it is thus not necessary to provide such an electrical connection or coupling by the arrangement of at least one additional, in particular conducting, layer above the printed circuit board regions connected to one another on the side faces and by elaborate through-contacts via passages or vias. The method according to the invention, in addition to a mechanical connection, thus enables a simple and reliable electrical coupling or connection of the printed circuit board regions to be connected to one another, on the at least one side face each adjoining one another, without increasing the thickness of the printed circuit board to be produced and by renouncing the elaborate positioning of respective electrical contacts or contact-connections after the arrangement of at least one additional conducting layer.

When using different printed circuit board regions to be connected to one another, it is to be anticipated, at least in some cases, that such printed circuit board regions to be connected to one another have different heights or thicknesses. Such subregions having different heights or thicknesses may, however, raise problems in further processing or working steps, which further steps in most cases require the presence of substantially flat elements and hence no elements having subregions with different heights. For a height or thickness compensation in a coupling or connection of printed circuit board regions having different heights, it is proposed according to the invention that the printed circuit board regions having different heights or thicknesses are laminated, at least on the surfaces having differently high regions, with a laminate comprising at least one insulating layer facing the printed circuit board regions and a conducting layer, while at least partially filling the gap on the mutually adjoining side faces, and, after this, the electrically conducting connection of electrically conductive subregions or connection ports is formed on the mutually adjoining side faces. This not only allows for a height compensation of printed circuit board regions possibly having different heights or thicknesses, but also enables the filling of the gap on the mutually adjoining side faces during the laminating step so as to achieve the desired mechanical connection or coupling of the printed circuit board regions to be connected to one another, so that a substantially adhesive-free connection of the printed circuit board regions will be provided. Following such a lamination in order to achieve height compensation, electrical contacting or coupling between individual subregions or connection ports on the mutually adjoining side faces can be formed or effected as described above.

In order to provide for a substantially symmetrical structure and, in particular, avoid possibly occurring unilateral mechanical stresses by providing such a laminate, it is proposed according to a preferred embodiment that the printed circuit board regions are laminated with a multilayer laminate on both surfaces.

A particularly reliable and simple electrical connection or coupling of respective elements of the printed circuit board regions to be connected to one another is provided according to a preferred embodiment in that the subregions or connection ports to be connected to one another of the at least one conducting layer and/or the conductive element of the device or component are electrically connected or coupled to one another by providing a conductive material for forming the electrical connection.

A simply producible electrically conductive connection between the printed circuit board regions to be connected to one another, is, moreover, preferably provided in that an electrically conducting metal such as copper, or a material containing at least one conducting or conductive component such as a copper-containing paste, is used for forming the electrically conductive connection. The use of such a conducting metal, or a material containing a conductive or conducting component, is known per se in the context of the production of a printed circuit board such that method steps known per se in the context of the production of a printed circuit board can be applied or employed for forming the electrically conductive connection provided according to the invention.

In order to provide for a simple and reliable coupling of printed circuit board regions to be connected to one another and, in particular, having different structures, it is provided according to a further preferred embodiment that electrically conducting layers are conductively connected or coupled to one another in different levels or planes of the printed circuit board regions to be connected to one another.

Likewise in consideration of printed circuit board regions to be connected to one another and having different configurations or structures, it is, moreover, proposed according to a further preferred embodiment that a different number of layers, and/or layers that are not adjusted to one another, are connected or coupled to one another.

For an optionally desired coupling of subregions of conductive layers that are located on different levels or heights and are to be electrically connected to one another, or of conducting elements of a device integrated in a printed circuit board region, it is, moreover, proposed that the electrically conductive connection is formed over a portion of the height of the printed circuit board regions to be connected to one another, as in correspondence with a further preferred embodiment of the method according to the invention.

Especially in consideration of the usually complex structure of such printed circuit board regions to be connected or coupled to one another, optionally containing a plurality of integrated devices or components, it is proposed according to a further preferred embodiment that a plurality of electrically conductive connections or couplings are mutually separately formed along the at least one side face adjoining one another, of the printed circuit board regions to be connected to one another. By using method steps known per se in the production of a circuit board, such a plurality of mutually separated connections or couplings can be reliably produced along the side face in order to provide for an electrically conductive connection of different structures or subregions.

For forming the electrically conductive connections, it is proposed according to a further preferred embodiment that passages or cavities are provided in the gap between mutually adjoining side faces for forming the electrically conductive connections by a drilling process, in particular mechanical drilling or laser drilling, or by a photoresist process.

After having formed such passages or cavities on the at least one side face adjoining one another, the electrically conductive connection, according to a further preferred embodiment of the method according to the invention, can, in particular, be produced in that the electrically conductive connection is formed by plating or filling the passages or cavities with a conducting metal, in particular copper, or by arranging pin-like elements made of conducting material.

Instead of separately forming a plurality of passages filled, or to be filled, with conducting material in order to realize the contacting of different subregions or connection ports or elements of the printed circuit board regions to be connected to one another, it is proposed according to a modified embodiment of the present invention that the gap between mutually adjoining side faces is filled with a conductive or conducting material, and that, after having filled the gap with conductive or conducting material, subregions of the same are separated from one another by forming passages or the like and, optionally, subsequently filling with insulating material for forming mutually separated contact-connections. It has thus become possible in a simple manner to fill with conducting material the gap or interstice between mutually adjoining side faces of the printed circuit board regions to be connected to one another, whereupon passages are formed to provide mutually separated subregions or contact-connections, which passages may optionally filled be with insulating material.

Both the production of a plurality of conducting contact-connections after the formation of appropriate passages according to the above-mentioned embodiment and the production of a separation of conducting subregions or contact-connections according to the last-mentioned embodiment may, for instance, be performed by accommodating or providing pin-like elements whose outer shapes are, in particular, adapted to the contours of the produced holes or passages and, for instance, formed to be circular, oval, rectangular or polygonal. In addition to achieving an electrical contacting or connection by providing such pin-like elements, the latter will also provide for a mechanical connection where appropriate inserts or pins are used to be inserted into the provided holes or passages, for instance by press-fitting.

Furthermore, a solid filler material can also be provided in the gap between adjoining printed circuit board regions to be connected to one another, which filler material is conducting or non-conducting, adapted to the contours of the gap or interstice between printed circuit board regions to be connected to one another, and/or optionally made of an appropriate film. By providing such a solid filler material, respective contact-connections or non-conducting regions can subsequently be provided or formed between the printed circuit board regions to be connected to one another, in the region of the mutually adjoining or facing side faces.

In order to achieve an overall thickness as small as possible of the printed circuit board to be produced, and/or provide a substantially plane or flat construction to be optionally provided with additional layers or plies of a multilayer circuit board in further production steps, it is, moreover, proposed that printed circuit board regions to be connected to one another are substantially arranged in a common plane and connected or coupled to one another, as in correspondence with a further preferred embodiment of the method according to the invention.

For a simple and reliable mechanical connection or coupling, it is proposed according to a further preferred embodiment that the mechanical coupling or connection of the printed circuit board regions to be connected to one another in a manner known per se is performed by gluing, press-fitting, laminating, bonding, welding, soldering or by a galvanic connection.

In addition to a final mechanical connection or coupling, a provisional mechanical connection or coupling can be provided or required in some cases between printed circuit board regions to be connected to one another, in particular in consideration of subsequent processing steps. In this context, it is proposed according to a further preferred embodiment that a provisional mechanical coupling or connection of the printed circuit board regions to be connected to one another is provided by using a filler material, by gluing or bonding, by press-fitting, by using a substrate such as an adhesive tape, or the like.

To support the mechanical coupling or connection, or provide a mechanical connection that is resistant to external stresses, it is, moreover, proposed that at least one mutually complementary coupling element is each formed, in a manner known per se, on mutually adjoining side faces of the printed circuit board regions to be connected to one another, via which coupling element a coupling or connection to the respectively adjoining printed circuit board region is realized, as in correspondence with a further preferred embodiment of the method according to the invention.

To further support the mechanical coupling or connection of the printed circuit board regions to be connected, it is, moreover, preferably proposed that mutually complementary coupling elements are connected to each other in a form-fitting manner.

In order to achieve a desired mechanical coupling or connection, it is proposed according to a further preferred embodiment that the mechanical coupling or connection is formed by using an adhesive in the region of the mutually complementary coupling elements. This will ensure the substantially bubble-free introduction of the adhesive in order to achieve the desired mechanical coupling or connection.

The method according to the invention can be used for printed circuit boards or printed circuit board regions of the most diverse designs or different structures, wherein it is provided according to a further preferred embodiment of the method according to the invention that the printed circuit board regions to be connected to one another in a manner known per se are comprised of flexible, rigid, rigid-flexible, or semi-flexible printed circuit board regions, and/or of functionally different materials including high-frequency, HDI, substrate or ceramic printed circuit board regions.

To solve the above-defined objects, a printed circuit board of the initially defined kind is essentially characterized in that the printed circuit board regions having different heights or thicknesses are laminated, at least on the surfaces having differently high regions, with a laminate comprising at least one insulating layer facing the printed circuit board regions and a conducting layer, while at least partially filling the gap on the mutually adjoining side faces. As already pointed out above, it has thus become possible to provide on the at least one lateral surface or side face adjoining one another a substantially lateral electrical coupling or connection of the printed circuit board regions to be connected to one another, such that, in particular, additional layers or plies covering the interface or connection region between the printed circuit board regions to be connected to one another as provided in the known prior art can be obviated.

Since printed circuit board regions to be connected to one another in many cases have different heights or thicknesses, it is proposed according to the invention, in order to achieve an appropriate height compensation for providing an element having uniform thickness or height dimensions, that the printed circuit board regions having different heights or thicknesses are laminated, at least on the surfaces having differently high regions, with a laminate comprising at least one insulating layer facing the printed circuit board regions and a conducting layer, while at least partially filling the gap on the mutually adjoining side faces.

To provide a substantially symmetrical structure when using such a laminate, it is proposed according to a further preferred embodiment that the printed circuit board regions are laminated with a multilayer laminate on both surfaces.

For a simple and reliable formation of the electrical connection, it is proposed according to a preferred embodiment that for the formation of the electrical connection a conductive material is provided in the region of the subregions or connection ports to be connected to one another of the at least one conducting layer and/or conductive element of the device or component.

In this context, it is proposed according to a further preferred embodiment that for the formation of the electrically conductive connection an electrically conducting metal such as copper, or a material containing at least one conducting or conductive component such as a copper-containing paste, is provided. In this manner, the electrical connection in the region of the mutually adjoining side faces can be directly formed or provided using materials usually employed in the production of a printed circuit board.

For connecting printed circuit board regions to be connected to one another and having different structures or different configurations, it is provided according to a further preferred embodiment that electrically conducting layers are conductively connected or coupled to one another in different levels or planes of the printed circuit board regions to be connected to one another.

Likewise for the adaptation to different structures or constructions of printed circuit board regions to be connected to one another, it is proposed according to a further preferred embodiment that a different number of layers, and/or layers that are not adjusted to one another, are connected or coupled to one another.

In particular for contacting or electrically connecting conducting structures or conducting elements of integrated devices or components located in different heights of the thickness of the printed circuit board regions to be connected to one another, it is, moreover, proposed that the electrically conductive connection is formed over a portion of the height of the printed circuit board regions to be connected to one another, as in correspondence with a further preferred embodiment of the method according to the invention, as in correspondence with a further preferred embodiment of the printed circuit board according to the invention.

Especially in consideration of the usually complex structure of such printed circuit board regions to be connected to one another and having a plurality of contact-connections or bonding sites, it is proposed according to a further preferred embodiment that a plurality of electrically conductive connections or couplings are mutually separately formed along the at least one side face adjoining one another, of the printed circuit board regions to be connected to one another.

For a particularly simple and reliable formation as well as positioning of the electrical connections to be produced, it is proposed according to a further preferred embodiment that passages or cavities are provided in the gap between mutually adjoining side faces for forming the electrically conductive connections or for separating electrically conducting subregions or contact-connections.

In this context, it is proposed according to a further preferred embodiment that the electrically conductive connection is formed by plating or filling the passages or cavities with a conducting metal, in particular copper, or by pin-like elements made of conducting material. Such platings are common and known per se in the context of the production of a printed circuit board such that, in particular, no additional method steps are to be provided in the production of a printed circuit board according to the invention. Besides, the use of pin-like elements made of conductive material is easily feasible.

In order to provide for a printed circuit board having a small overall height and/or a substantially plane or flat structure on which optionally required further layers or plies of a multilayer circuit board can be provided, it is proposed according to a further preferred embodiment that printed circuit board regions to be connected to one another are substantially arranged in a common plane and connected or coupled to one another.

A reliable mechanical connection or coupling is, for instance, provided in that the mechanical coupling or connection of the printed circuit board regions to be connected to one another in a manner known per se is formed by gluing, press-fitting, laminating, bonding, welding, soldering, or by a galvanic connection, as in correspondence with a further preferred embodiment of the printed circuit board according to the invention.

For providing a provisional mechanical coupling, it is proposed according to a preferred embodiment that a provisional mechanical coupling or connection of the printed circuit board regions to be connected to one another is provided by using a filler material, by gluing or bonding, by press-fitting, by using a substrate such as an adhesive tape, or the like.

To support the mechanical coupling or connection, it is, moreover, preferably proposed that at least one mutually complementary coupling element is each provided, in a manner known per se, on mutually adjoining side faces of the printed circuit board regions to be connected to one another, via which coupling element a coupling or connection to the respectively adjoining printed circuit board region is formed.

To further improve the mechanical coupling, it is, moreover, preferably proposed that mutually complementary coupling elements are connectable to each other in a form-fitting manner.

In order to achieve a particularly reliable mechanical coupling, it is provided according to a further preferred embodiment that the mechanical coupling or connection is formed by using an adhesive in the region of the mutually complementary coupling elements.

As already pointed out above, a coupling or connection of printed circuit board regions having different designs and different structures is feasible according to the invention, wherein, in this context, it is proposed according to a further preferred embodiment that the printed circuit board regions to be connected to one another in a manner known per se are comprised of flexible, rigid, rigid-flexible, or semi-flexible printed circuit board regions, and/or of functionally different materials including high-frequency, HDI, substrate or ceramic printed circuit board regions.

In order to ensure simple positioning and alignment during the coupling or connection of printed circuit board regions to be connected to one another, it is, moreover, proposed that the printed circuit board regions to be connected to one another are formed with at least one marker, in particular a pin or the like, for registration during connection, as in correspondence with a further preferred embodiment of the printed circuit board according to the invention.

SHORT DESCRIPTION OF THE DRAWINGS

In the following, the invention will be explained in more detail by way of exemplary embodiments schematically illustrated in the accompanying drawing. Therein:

FIG. 1 depicts schematic illustrations of embodiments according to the prior art, FIG. 1a showing a configuration in which the printed circuit board regions to be connected to one another are covered by further layers or plies for an electrical connection; and FIG. 1b showing additional devices provided in the region of the connection of adjoining printed circuit board regions for an electrical connection;

FIG. 2 is a schematic top view of a printed circuit board according to the invention produced by the method of the invention, wherein a plurality of electrical connections or couplings are provided in the region of the side faces of mutually adjoining printed circuit board regions;

FIG. 3 depicts schematic side views of different configurations of an electrical connection between adjoining printed circuit board regions, which is each produced by the method according to the invention;

FIG. 4 depicts schematic top views of different configurations of electrical connections of printed circuit board according to the invention;

Figures 8, 8A:
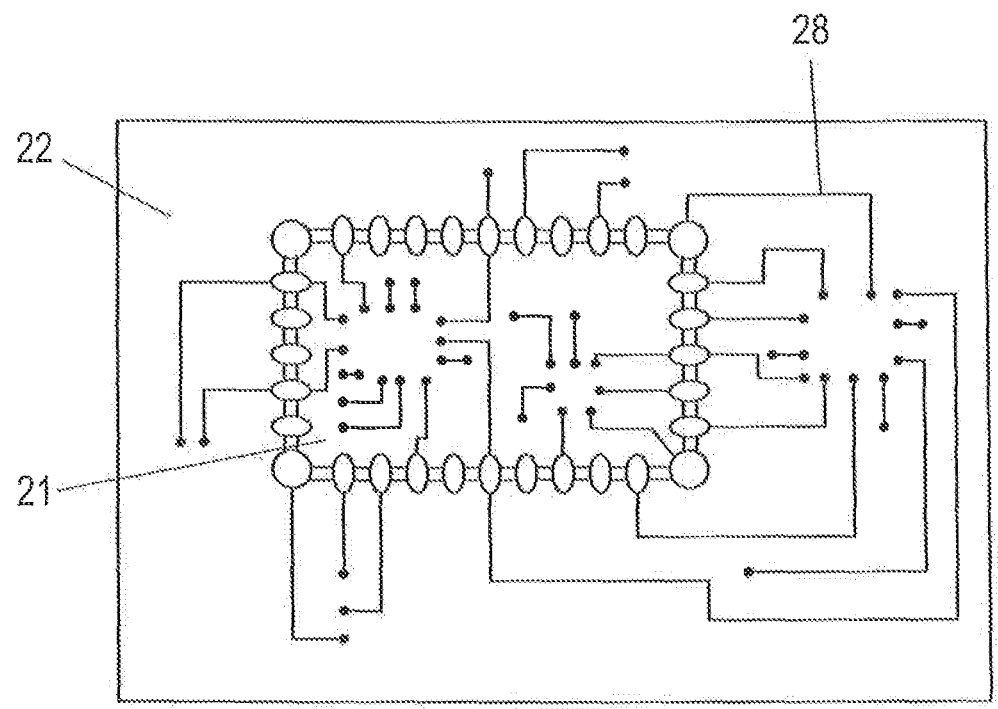

FIG. 5, in an illustration similar to that of FIG. 4, depicts top views of different geometric designs of the connection or coupling of printed circuit board regions to be connected to one another of a printed circuit board according to the invention;

FIG. 6, in an illustration similar to those of FIGS. 4 and 5, depicts top views of different configurations of electrical connections of a printed circuit board according to the invention in the region of the side faces of mutually adjoining printed circuit board regions;

FIG. 7, on an enlarged scale, depicts a partial section through a printed circuit board according to the invention, from which it is, in particular, clearly apparent that the printed circuit board regions to be connected to one another comprise a plurality of layers of plies located, in particular, in different heights;

FIG. 8 depicts schematic illustrations of electrical connections of different layers or plies of the embodiment according to FIG. 7, wherein different subregions of the respective conducting structures of adjoining printed circuit board regions are electrically connectable or coupleable in different levels due to the arrangement of a plurality of electrical connection or contact sites or areas;

FIG. 9, in an illustration similar to that of FIG. 5d, depicts a modified embodiment of a coupling between printed circuit board regions to be connected to one another; and FIG. 10 depicts schematic illustrations of a modified embodiment of the method according to the invention, wherein, in particular for height compensation of printed circuit board regions to be connected to one another and having different heights or thicknesses, a lamination with a multilayer laminate is performed, FIG. 10a depicting the step of laminating a multilayer laminate on one side or surface of the printed circuit board regions to be connected to one another, FIG. 10b illustrating a subsequent method step of laminating a second surface of the printed circuit board regions to be connected to one another, and FIG. 10c illustrating the subsequent formation of electrically conducting connections in the region of the mutually adjoining side faces of the printed circuit board regions to be connected to one another.

DETAILED DESCRIPTION OF PREFERRED EMBODIMENTS

FIGS. 1a and 1b each depict an, in particular, multilayer circuit board region 101 according to the prior art, which is enclosed by a further, likewise multilayer circuit board region 102 surrounding the printed circuit board regions 101, wherein a mechanical connection or coupling not illustrated in detail is provided between the circuit board regions 101 and 102 in the region of mutually adjoining side faces 103. In addition to the mechanical connection or coupling not illustrated in detail, which is to be provided in the region of the mutually adjoining side faces 103 between the circuit board regions 101, 102 to be connected to each other, it is apparent from the embodiment according to FIG. 1a that additional layers or plies 104, 104 are provided for an electrical connection or coupling to be additionally provided or required. An electrical contact-connection to the additional layers 105 and at least one conducting layer or ply 108, 109 of the circuit board regions 101, 102 is realized by schematically indicted vias 106.

Instead of providing additional layers or plies for an electrical connection or contacting, it is provided in the embodiment according to the prior art corresponding to FIG. 1b that additional devices 107 are provided in the region of the mutually facing side faces 103 so as to partially cover the same, electrical contacting being again indicated by vias 106.

From the illustrations according to FIG. 1, it is thus apparent that additional layers or plies 104 and 105 and additional devices 107 have to be provided for the electrical connection or coupling of conducting structures 108, 109 of the circuit board regions 101, 102 to be connected or coupled to each other.

In contrast thereto, the embodiment according to the invention, which is illustrated in FIG. 2, contemplates that a plurality of electrical connections or couplings 4 are provided in the region of the respectively mutually adjoining side faces 3 for the electrically conducting connection or coupling between a printed circuit board region 1 and a printed circuit board region 2 surrounding the former, as will be discussed in detail below.

By providing such electrical connections or couplings in the region of the mutually adjoining side faces 3, a lateral electrical coupling or connection is attainable between the printed circuit board regions 1 and 2 to be connected to each other or conducting structures, wherein the provision of additional layers or plies or devices covering the mutually adjoining side faces 3 as required in the prior art according to FIG. 1 can be obviated.

FIG. 3 depicts different embodiments of such an electrical connection or coupling between printed circuit board regions again denoted by 1 and 2. While at least one conducting layer is each indicated by 31 in the printed circuit board region 1, a device 32 is each integrated in the printed circuit board region 2, a conducting element or port of the former being indicated at 33.

In the embodiment according to FIG. 3a, a slot or passage 4 provided in the region of the side face 3 is provided with a plating 5 made, for instance, of copper, via which a contact-connection of a conducting structure not illustrated in detail of the at least one conducting layer to the conducting element 33 of the device 32 integrated in the printed circuit board region 2 is established.

Instead of a plating 5 as illustrated in FIG. 3a, the embodiment according to FIG. 3b provides that such a passage or slot 4 is substantially completely filled with a conducting material 6 so as to produce a conducting connection. Such a conducting material can, for instance, be comprised of copper or any other electrically conducting or conductive material, in particular metal.

In the embodiment according to FIG. 3c, substantially complete filling of the gap or passage 4 between the electrical structures 31, 32 and 33 to be connected and integrated in the printed circuit board regions 1 and 2 is again provided, wherein, in this embodiment, an appropriate cavity or passage is, for instance, filled with a conductive material, e.g. a material 7 comprising a copper paste. Such a pasty conductive material 7 can be appropriately cured for producing an appropriate connection.

Instead of, or in addition to, copper, other conducting or conductive materials or metals can be used as well.

From the illustrations according to FIGS. 3b and 3c, it is moreover apparent that, for instance, the conducting layers or plies 31 and also the integrated elements or devices 32 and their ports or conducting elements 33 are provided or arranged at different heights in the printed circuit board regions 1 and 2 to be connected to each other. In the embodiment according to FIG. 3c, it is further indicated that a conducting layer again denoted by 31 is also provided in the printed circuit board region 2.

Instead of plating or filling the gap or interstice or a passage 4 between the printed circuit board regions 1 and 2 to be connected to each other, pin-like elements can also be inserted into this gap 4 or respective bores or passages, the outer shape of said pin-like elements, for instance, corresponding to the contours of the gap or a passage between the printed circuit board regions 1 and 2 to be connected to each other.

The connections 5, 6 and 7 respectively provided between the printed circuit board regions 1 and 2 to be connected to each other, which constitute electrical contact-connections between subregions to be connected or connection ports of the conducting layers 31, which are, in particular, formed by structured conducting layers, and the connection elements 33 of the integrated devices 32 are also able to provide, in addition to an electrical connection, an appropriate mechanical coupling or connection between the printed circuit board regions 1 and 2 to be connected to each other.

The formation of respective cavities or passages 4 in the region of the mutually adjoining side faces 3 of printed circuit board regions 1 and 2 to be connected to each other can be performed by drilling, e.g. mechanical drilling or laser drilling, cutting, in particular laser cutting, or the like.

In the illustration according to FIG. 4, the formation of a plurality of mutually separated passages for the production of an electrically conducting connection between printed circuit board regions again denoted by 1 and 2 according to the embodiment of FIG. 4a is performed using a photoresist process. In doing so, a photoresist is introduced into the gap substantially provided over the entire periphery of the printed circuit board region 1 to be embedded, whereupon an exposure is made after hardening, and cavities or passages required for a subsequent electrical connection are produced by washing out the photoresist in an exposed or non-exposed region as a function of the photoresist material used. Such remaining regions of the photoresist material are denoted by 9 in FIG. 4a, while free spaces or cavities 10 located therebetween are subsequently at least partially filled with a material creating a conducting connection as explained, for instance, with reference to FIG. 3.

Alternatively, the gap surrounding a printed circuit board region 1 to be embedded can be substantially completely filled with a conducting material 11, as is apparent from the illustration according to FIG. 4b. In the configuration according to FIG. 4b, cavities or slots 12 extending substantially transversely to the slot defined by the adjoining side faces are provided for subdivision into mutually separated electrical connections for coupling different electrical structures in the printed circuit board regions 1 and 2 to be connected to each other, said cavities or slots 12 separating intermediate regions 11 so as to provide individual conducting or conductive connections. Into these slots or cavities 12 can, for instance, be introduced a non-conducting material or pin-like elements made of non-conducting material.

FIG. 5 depicts different embodiments of possible geometric configurations or arrays of electrically conducting connections each in the region of mutually adjoining side faces of printed circuit board regions 1 and 2 to be connected to each other. In the embodiments according to FIGS. 5a, 5b and 5c, an electrically conducting connection is thus provided along different contours between the printed circuit board regions 1 and 2 to be connected to each other, FIG. 5a depicting a substantially rectangular contour 13. By contrast, the configuration according to FIG. 5b has a substantially circular contour 14, while an irregularly dimensioned contour 15 is provided in the embodiment according to FIG. 5c.

From the configuration according to FIG. 5d, it is moreover apparent that, in particular for supporting a mechanical connection or coupling between the printed circuit board regions 1 and 2, mutually complementary projections or profilings 16 enabling a substantially form-fitting mechanical coupling between the printed circuit board regions 1 and 2 are provided.

In the embodiment according to FIG. 5e, it is moreover indicated that, in particular for the correct positioning of the printed circuit board regions 1 and 2 to be connected to each other, markers 17 and 18 are provided for positioning on the printed circuit board regions 1 and 2.

Despite the continuous contours of the connections 13 to 15 of FIGS. 5a to 5e, a subdivision into mutually separated electrical connections may be provided in a manner similar to the configuration according to FIG. 4.

Similarly as in the illustrations according to, in particular, FIG. 2 and FIG. 4b, the embodiments according to FIGS. 6a to 6d each show configurations respectively comprising a plurality of mutually separated electrical connections generally denoted by 19 along the mutually adjoining side faces of the printed circuit board regions 1 and 2 to be connected to each other. The cavities or passages on which the electrically conducting connections can subsequently be formed in the embodiments according to FIGS. 6a to 6d, for instance similarly as in the embodiments according to FIG. 3, can again be made, for instance, by drilling holes or forming appropriate slots.

From the illustration according to FIG. 6d, it is moreover apparent that a substantially continuous electrical connection 20 between electrically conducting subregions (not illustrated) of the printed circuit board regions 1 and 2 has a partially irregular contour.

The irregular contour depicted in FIG. 6d may be replaced with an appropriate serration of mutually adjoining side faces of the printed circuit board regions 1, 2 to be connected to each other, which is formed in the manner of crenellations or projections and complementary depressions or recesses.

FIG. 7 in greater detail and on an enlarged scale illustrates a subregion of printed circuit board regions 21 and 22 to be connected to each other, wherein it is apparent the both of the printed circuit board regions 21 and 22 comprise a plurality of layers or plies located, in particular, in different planes or levels, wherein, moreover, structured conducting elements or connection ports 23 and 24 are each schematically indicated.

In the region of mutually adjoining side faces 25, 26 of the printed circuit board regions 21 and 22 to be connected to each other, a cavity or slot 27 is indicated, which is to be filled with a conducting or conductive material, e.g. copper, for the electrical coupling of individual conducting subregions of layers to be connected, for instance again similarly as in the embodiment according to FIG. 3.

When forming the electrically conducting connection each merely over a subregion of the thickness or height of the printed circuit board regions 21, 22 to be connected to each other, different conducting structures can thus be directly coupled or connected in different heights of the printed circuit board regions 21, 22 to be connected to each other.

Such coupling of different subregions or layers of the printed circuit board regions to be connected to each other, each via a plurality of electrical connections is schematically illustrated in FIGS. 8a, 8b and 8c. FIG. 8a shows how the conducting structures provided, for instance, in an uppermost layer or ply of the printed circuit board regions 21 and 22 to be connected to each other and illustrated in FIG. 7 are coupled to a plurality of positions or sites 28 of an electrical connection or coupling.

By contrast, FIG. 8b schematically depicts an electrical connection or coupling of other conducting structures of the inner printed circuit board region 22, while FIG. 8c shows conducting structures for the outer printed circuit board region 21, wherein electrical connections again denoted by 28 are provided.

FIG. 9 in an illustration similar to that of FIG. 5d depicts a modified embodiment of a connection of printed circuit board regions 1 and 2 to be connected to each other, wherein an adhesive is used to obtain the desired mechanical coupling in the region of the mutually complementary coupling elements 16, as is indicated by 34. In this manner, bubble-free filling with adhesive is, in particular, enabled in the region of the mutually complementary coupling sites 16.

From the method steps represented in FIG. 10, it is apparent that the printed circuit board regions 1 and 2 to be connected to each other have different heights or thicknesses. For height compensation in order to provide for a substantially plane or full-area surface, which will facilitate subsequent processing or working steps or be required therefor, FIG. 10a illustrates that the printed circuit board regions to be connected to each other are, for instance, arranged on a support layer 42, e.g. an adhesive tape, whereupon a lamination with a multilayer laminate 35 is performed, said laminate 35 comprising at least one insulating layer 36, e.g. a prepreg, which faces the printed circuit board regions 1 and 2 to be connected to each other. In addition, the laminate 35, for instance, comprises a conducting layer 37 formed by a copper film.

In the exemplary embodiment illustrated in FIG. 10a, an additional insulation material 38, which is adapted to the dimensions of the printed circuit board region 1 having a smaller height and is formed by a prepreg like layer 36, is used to compensate for the comparatively large differences in the thickness or height of the printed circuit board regions 1 and 2 to be connected to each other.

The lamination in the sense of arrow 39 of the laminate 35 and the additional prepreg element 38 with the printed circuit board regions 1 and 2 to be connected to each other, which are supported on a support layer 42, causes not only a connection to the surfaces facing the prepreg material 36 and 38, respectively, of the printed circuit board regions 1 and 2 to be connected to each other, but also the partial filling of the gap between the mutually facing side faces 3 as indicated in FIG. 10b.

In the method step illustrated in FIG. 10b, the lamination with the laminate 35 according to the method step depicted in FIG. 10a and the removal of the support layer 42 are followed by a further lamination with a multilayer laminate 35, which is likewise formed by a prepreg 36 and a conducting layer 37, as is indicated by arrow 40.

For the subsequent production of the electrically conducting connections of different conducting subregions or connection ports in the printed circuit board regions 1 and 2 to be connected to each other, which are not illustrated in detail in FIG. 10 for the sake of simplicity, the formation of bores, for instance by drilling operations as indicated by arrows 41, and the subsequent filling with a conducting or conductive material are performed as repeatedly explained and illustrated in connection with preceding embodiments.

The mechanical coupling or connection of the printed circuit board regions 1, 2 or 21 and 22, respectively, to be connected to each other can, for instance, be effected by gluing, press-fitting, laminating, bonding, welding, soldering, or by a galvanic connection.

It is, moreover, possible to form both a mechanical and an electrical connection or coupling between the printed circuit board regions 1 and 2 or 21 and 22, respectively, to be connected to each other in such a manner that the printed circuit board regions 1 and 2 or 21 and 22, respectively, to be connected to each other are, for instance, merely connected on a mutually adjoining side face, while in the above embodiments a printed circuit board region is each substantially completely surrounded over its entire periphery by a further printed circuit board region.

As already pointed out above, it is possible to connect a plurality of different printed circuit boards or printed circuit board regions, wherein the printed circuit board regions 1 and 2 or 21 and 22, respectively, can, for instance, be formed by flexible, rigid, rigid-flexible or semi-flexible printed circuit board regions. In addition, or alternatively, functionally different materials such as high-frequency, HDI, substrate or ceramic printed circuit board regions may also be provided for coupling.

The invention claimed is:
1. A method for producing a printed circuit board consisting of at least two printed circuit board regions, wherein the printed circuit board regions each comprise at least one conductive layer, in particular a structured conductive layer, and/or at least one device or conductive component, wherein printed circuit board regions to be connected to one another, in the region of in each case at least one lateral surface directly adjoining one another, are connected to one another by a mechanical coupling or connection, wherein at least one subregion or connection port of the at least one conductive layer and/or a conductive element of the device or component of the printed circuit board regions mechanically connected or to be mechanically connected to one another are electrically conductively connected or coupled to each other on the at least one lateral surface adjoining one another, wherein the printed circuit board regions having different heights or thicknesses are laminated, at least on the surfaces having differently high regions, with a laminate comprising at least one insulating layer facing the printed circuit board regions and a conducting layer, while at least partially filling the gap on mutually adjoining side faces, and after this the electrically conducting connection of electrically conductive subregions or connection ports is formed on the mutually adjoining side faces.

2. The method according to claim 1, wherein the printed circuit board regions are laminated with a multilayer laminate on both surfaces.

3. A The method according to claim 1, wherein the subregions or connection ports to be connected to one another of the at least one conducting layer and/or the conductive element of the device or component are electrically connected or coupled to one another by providing a conductive material for forming the electrical connection.

4. The method according to claim 1, wherein an electrically conducting metal such as copper, or a material containing at least one conducting or conductive component such as a copper-containing paste, is used for forming the electrically conductive connection.

5. The method according to claim 1, wherein electrically conducting layers are conductively connected or coupled to one another in different levels or planes of the printed circuit board regions to be connected to one another.

6. The method according to claim 1, wherein a different number of layers, and/or layers that are not adjusted to one another, are connected or coupled to one another.

7. The method according to claim 1, wherein the electrically conductive connection is formed over a portion of the height of the printed circuit board regions to be connected to one another.

8. The method according to claim 1, wherein a plurality of electrically conductive connections or couplings are mutually separately formed along the at least one side face adjoining one another, of the printed circuit board regions to be connected to one another.

9. The method according to claim 1, wherein passages or cavities are provided in the gap between mutually adjoining side faces for forming the electrically conductive connections by a drilling process, in particular mechanical drilling or laser drilling, or by a photoresist process.

10. The method according to claim 9, wherein the electrically conductive connection is formed by plating or filling the passages or cavities with a conducting metal, in particular copper, or by arranging pin-like elements made of conducting material.

11. The method according to claim 1, wherein the gap between mutually adjoining side faces is filled with a conductive or conducting material, and that, after having filled the gap with conductive or conducting material, subregions of the same are separated from one another by forming passages and, optionally, subsequent filling with insulating material for forming mutually separated contact-connections.

12. The method according to claim 1, wherein printed circuit board regions to be connected to one another are substantially arranged in a common plane and connected or coupled to one another.

13. The method according to claim 1, wherein the mechanical coupling or connection of the printed circuit board regions to be connected to one another in a manner known per se is performed by gluing, press-fitting, laminating, bonding, welding, soldering, or by a galvanic connection.

14. The method according to claim 1, wherein a provisional mechanical coupling or connection of the printed circuit board regions to be connected to one another is provided by using a filler material, by gluing or bonding, by press-fitting, by using a substrate such as an adhesive tape, or the like.

15. The method according to claim 1, wherein at least one mutually complementary coupling element is each formed, in a manner known per se, on mutually adjoining side faces of the printed circuit board regions to be connected to one another, via which coupling element a coupling or connection to the respectively adjoining printed circuit board region is realized.

16. The method according to claim 15, wherein mutually complementary coupling elements are connected to each other in a form-fitting manner.

17. The method according to claim 14, wherein the mechanical coupling or connection is formed by using an adhesive in the region of the mutually complementary coupling elements.

18. The method according to claim 1, wherein the printed circuit board regions to be connected to one another in a manner known per se are comprised of flexible, rigid, rigid-flexible, or semi-flexible printed circuit board regions, and/or of functionally different materials including high-frequency, HDI, substrate or ceramic printed circuit board regions.

19. A printed circuit board consisting of at least two printed circuit board regions, wherein the printed circuit board regions each comprise at least one conductive layer, in particular a structured conductive layer, and/or at least one device or conductive component, wherein printed circuit board regions to be connected to one another, in the region of in each case at least one lateral surface directly adjoining one another, are connected to one another by a mechanical coupling or connection, wherein an electrically conductive coupling or connection is provided or formed between at least one subregion or connection port of the at least one conductive layer and/or a conductive element of the device or component of the printed circuit board regions mechanically connected or to be mechanically connected to one another, on the at least one lateral surface adjoining one another, wherein the printed circuit board regions having different heights or thicknesses are laminated, at least on the surfaces having differently high regions, with a laminate comprising at least one insulating layer facing the printed circuit board regions and a conducting layer, while at least partially filling the gap on mutually adjoining side faces.

20. The printed circuit board according to claim 19, wherein the printed circuit board regions are laminated with a multilayer laminate (35) on both surfaces.

21. The printed circuit board according to claim 19, wherein for the formation of the electrical connection a conductive material is provided in the region of the subregions or connection ports to be connected to one another, of the at least one conducting layer and/or conductive element of the device or component.

22. The printed circuit board according to claim 19, wherein for the formation of the electrically conductive connection an electrically conducting metal such as copper, or a material containing at least one conducting or conductive component such as a copper-containing paste, is provided.

23. The printed circuit board according to claim 19, wherein electrically conducting layers are conductively connected or coupled to one another in different levels or planes of the printed circuit board regions to be connected to one another.

24. The printed circuit board according to claim 19, wherein a different number of layers, and/or layers that are not adapted to one another, are connected or coupled to one another.

25. The printed circuit board according to claim 19, wherein the electrically conductive connection is formed over a portion of the height of the printed circuit board regions to be connected to one another.

26. The printed circuit board according to claim 19, wherein a plurality of electrically conductive connections or couplings are mutually separately formed along the at least one side face adjoining one another, of the printed circuit board regions to be connected to one another.

27. The printed circuit board according to claim 19, wherein passages or cavities are provided in the gap between mutually adjoining side faces for forming the electrically conductive connections or for separating electrically conducting subregions or contact-connections.

28. The printed circuit board according to claim 27, wherein the electrically conductive connection is formed by plating or filling the passages or cavities with a conducting metal, in particular copper, or by pin-like elements made of conducting material.

29. The printed circuit board according to claim 19, wherein printed circuit board regions to be connected to one another are substantially arranged in a common plane and connected or coupled to one another.

30. The printed circuit board according to claim 19, wherein the mechanical coupling or connection of the printed circuit board regions to be connected to one another in a manner known per se is formed by gluing, press-fitting, laminating, bonding, welding, soldering, or by a galvanic connection.

31. The printed circuit board according to claim 19, wherein a provisional mechanical coupling or connection of the printed circuit board regions to be connected to one another is provided by using a filler material, by gluing or bonding, by press-fitting, by using a substrate such as an adhesive tape, or the like.

32. The printed circuit board according to claim 19, wherein at least one mutually complementary coupling element is each provided, in a manner known per se, on mutually adjoining side faces of the printed circuit board regions to be connected to one another, via which coupling element a coupling or connection to the respectively adjoining printed circuit board region is formed.

33. The printed circuit board according to claim 32, wherein mutually complementary coupling elements are connectable to each other in a form-fitting manner.

34. The printed circuit board according to claim 32, wherein the mechanical coupling or connection is formed by using an adhesive in the region of the mutually complementary coupling elements.

35. The printed circuit board according to claim 19, wherein the printed circuit board regions to be connected to one another in a manner known per se are comprised of flexible, rigid, rigid-flexible, or semi-flexible printed circuit board regions, and/or of functionally different materials including high-frequency, HDI, substrate or ceramic printed circuit board regions.

36. The printed circuit board according to claim 19, wherein the printed circuit board regions to be connected to one another are formed with at least one marker, in particular a pin or the like, for registration during connection.

* * * * *